United States Patent [19]

Mehrotra et al.

[11] Patent Number: 5,920,201
[45] Date of Patent: Jul. 6, 1999

[54] CIRCUIT FOR TESTING PUMPED VOLTAGE GATES IN A PROGRAMMABLE GATE ARRAY

[75] Inventors: Alok Mehrotra, Los Gatos; Charles R. Erickson, Fremont, both of Calif.

[73] Assignee: Xilinx, Inc., San Jose, Calif.

[21] Appl. No.: 08/935,567

[22] Filed: Sep. 23, 1997

Related U.S. Application Data

[62] Division of application No. 08/588,160, Jan. 17, 1996, Pat. No. 5,717,340.

[51] Int. Cl.$^6$ ..................................................... G01R 27/22
[52] U.S. Cl. .............................................................. 324/765
[58] Field of Search ............................... 324/158.1, 765, 324/763, 769, 73.1, 500, 537, 716, 719, 523; 438/14, 17, 8; 365/200, 201; 371/21.1, 21.2, 22.1–22.5; 257/40, 48

[56] References Cited

U.S. PATENT DOCUMENTS

| | | | |
|---|---|---|---|
| 5,255,271 | 10/1993 | Tatman et al. | 371/22.1 |
| 5,517,107 | 5/1996 | Ovens et al. | 324/158.1 |
| 5,521,524 | 5/1996 | Houston | 324/765 |
| 5,617,021 | 4/1997 | Goetting et al. | 324/158.1 |

OTHER PUBLICATIONS

"The Programmable Logic Data Book", (1994), pp. 2–9 to 2–16, published by Xilinx, Inc., 2100 Logic Drive, San Jose, California 95124. (Unavailable month).

*Primary Examiner*—Vinh P. Nguyen
*Attorney, Agent, or Firm*—James P. Hao; Wagner Murabito & Hao; Jeanette S. Harms

[57] ABSTRACT

In a field programmable gate array, a test circuit for testing the signal path of a line, through a pass gate, and onto a second line. A memory cell outputs at a $V_{GG}$ level, where $V_{GG} \geq V_{DD} + V_{TN}$. In order to dynamically test the signal path, three transistors and two test signals are used to apply either 0 volts or $V_{GG}$ to control the pass gate. Two of the transistors are coupled to the memory cell and the pass gate, whereas the third transistor is coupled to the first and second transistors and ground. The two test signals and an inverter control these transistors so that the memory state can be changed to dynamically switch the pass gate according to the test configuration. An electrical signal is then sent through the signal path under test, and the result is monitored.

9 Claims, 5 Drawing Sheets

5,920,201

CIRCUIT FOR TESTING PUMPED VOLTAGE GATES IN A PROGRAMMABLE GATE ARRAY

This application is a division of application Ser. No. 08/588,160, filed Jan. 17, 1996, now U.S. Pat. No. 5,717, 340.

FIELD OF THE INVENTION

The present invention pertains to a test circuit used for testing pumped voltage gates in a field programmable gate array.

BACKGROUND OF THE INVENTION

Integrated circuit (IC) semiconductor chips are the critical components found in virtually all modern telecommunications, computer, and electronics products. Many of these semiconductor chips are custom-made and tailored to the exact specifications supplied by the designers. However, these custom chips can be quite expensive to produce, and thus not ideally suited for those instances where only a limited quantity of chips are desired. Furthermore, it can take quite a long time to fabricate these custom chips. In today's competitive environment, time-to-market is of utmost importance. Moreover, if there is an error somewhere in the initial design or layout, more delays are incurred in fixing the problems.

In response to the shortcomings inherent to custom IC chips, field-programmable gate arrays (FPGAs) were developed. An FPGA is a standard off-the-shelf semiconductor chip that can be individually programmed to perform the desired functions. FPGAs can be reprogrammed an unlimited number of times and can be used in innovative designs where hardware is changed dynamically, or where hardware must be adapted to different user applications. An FPGA is typically comprised of three major configurable elements: configurable logic blocks (CLBs), input/output blocks (IOBs), and an interconnect network. The CLBs provide the functional elements for constructing the desired logic. The IOBs provide the interface between the package pins and internal signal lines. And the interconnection resources provide routing paths, programmable intersection points, and switch matrices to transfer the input and output signals of the CLBs and IOBs onto the appropriate networks.

One of the most basic building blocks of an FPGA is known as a "gate". A gate is typically comprised of a transistor that can either be turned on to conduct an electrical signal or turned off so that the electrical signal is not conducted through the transistor. In this manner, gates can be programmed to route electrical signals according to the dictates of a user. These gates can also be used in various combinations to perform logic functions on the electrical signals according to the specifications supplied by the user.

FIG. 1 shows a prior art circuit of how a gate 101 is used to coupled a signal on either of the local lines 102 and 103 onto a long line 104. Memory cell 105 controls transistors 106 and 107 to select either the IN1 signal on line 102 or the IN2 signal on line 103 to be input to buffer 108. Memory cell 105 is comprised of static memory (e.g., SRAM). Buffer 108 drives the selected signal. Gate 101 determines whether to pass that signal onto longline 104. Gate 101 also acts to isolate the longline 104 from the local lines 102 and 103. Another memory cell 109 is used to control gate 101. If the Q output from-memory cell 109 is low (e.g., 0 volts), the signal from buffer 108 is not conducted onto longline 104. A high Q output (e.g., +5 volts) causes the signal from buffer 108 to be routed onto longline 104.

Oftentimes, it is desirable to test the signal paths and gates to ensure that they are properly working. The simplest method for accomplishing this is to configure the FPGA to specifically target the signal path and gate under test. Next, a test signal is injected, and the output is monitored. However, in order to test a different gate, one needs to enter a new configuration corresponding to the new gate and signal path being tested, inject the test signal, and monitor the output signal. Clearly, repeating this testing procedure for each gate is extremely cumbersome and time-consuming, especially if one wishes to test numerous gates.

A faster approach is to test the various gates and signal paths on an interactive basis. This is accomplished by adding two transistors 110 and 111 and using three test signals: Test Mode (TM), Test Mode Bar (TMB), and Test Tri-State (TESTTS). If the TM signal is set high, this causes transistor 111 to conduct the TESTTS signal onto node 112. Simultaneously, the TMB signal causes transistor 110 to cut off the Q output signal of memory cell 109 from reaching node 112. As a result, gate 101 is controlled by the TESTTS signal and not the Q signal from memory cell 109. Thereby, one can use the TESTTS signal to test the signal path from a local interconnect line (e.g., lines 102 or 103), through a gate (e.g., transistor 101), and to a longline (e.g., line 104).

However, serious problems arise due to the fact that there is an inherent body-effected threshold voltage drop, VTN, associated with the n-channel transistor 101. This voltage drop can cause serious problems with circuits that are subsequently coupled onto longline 104.

One approach to overcoming this potential problem involves the use of "native=P" transistors which are well known in the art and therefore are not explained herein. These native transistors have higher threshold voltages than conventional transistors. Hence, the native transistors are less susceptible to the voltage drops inherent across the gates. However, one sacrifices speed when using these native transistors because it takes a longer time for these native transistors to switch on and off. Another approach has been to use "transmission" gates which are also well known to those in the art. However, each transmission gate requires an additional p-channel transistor as well as an additional inverter. Therefore, using transmission gates increases the size of a die. Increasing the die size directly translates into higher manufacturing costs because less dies (i.e., chips) can be fabricated per wafer.

A more cost-effective solution involves using a voltage pump to increase the supply voltage to the memory cells and gates. For example, instead of supplying the traditional 5 volts, a voltage pump can be used to increase an auxiliary supply voltage to 7 volts. This pumped voltage approach works fine for static memory cells in the ordinary functionality of the FPGA where they switch once and stay at their particular levels. However, pumped voltage memory cells are far too slow to function in a dynamic mode for testing purposes. Hence, a need arises for a testing circuit that is capable of being dynamically driven at the higher pumped voltage levels.

SUMMARY OF THE INVENTION

The present invention pertains to a test circuit in a field programmable logic drive which is used to dynamically test the signal path of a first electrical line, through a pass gate, and onto a second electrical line. One memory output signal is operated at a voltage $V_{GG}$ wherein $V_{GG} \geq$ VDD (a supply voltage)+VTN (a threshold voltage of the pass gate). In other words, one memory output signal is operated at a higher voltage level than the supply voltage. In order to dynamically test the signal path, three transistors and three test signals are used to selectively apply either 0 volts or voltage $V_{GG}$ to control the pass gate. One of these transistors is coupled to a first output terminal of the memory cell and the pass gate, whereas a second transistor is coupled to a second output terminal of the memory cell (which provides the inverse of the signal on the first output terminal) and the pass gate. A third transistor is coupled to the first and second transistors and ground. The three test signals control these transistors so that in the test mode the test circuit selectively applies a low signal to one output terminal of the memory cell. Hence, the pass gate is dynamically controlled according to the test signals being applied. An electrical signal is then sent through the signal path under test, and the result is monitored.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
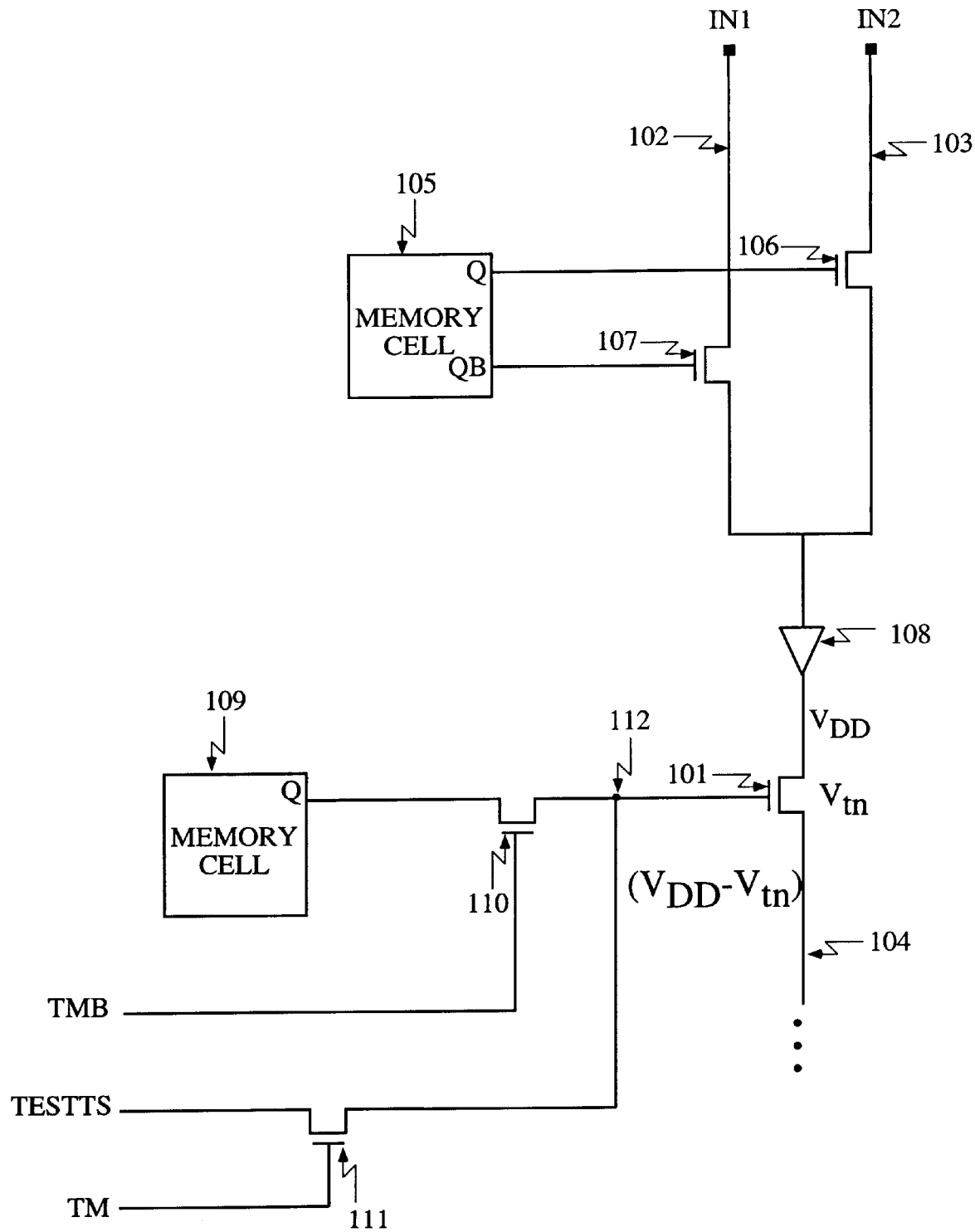
FIG. 1 shows a prior art circuit used to provide a signal on either of two lines onto another line via a pass gate.
Figure 2:
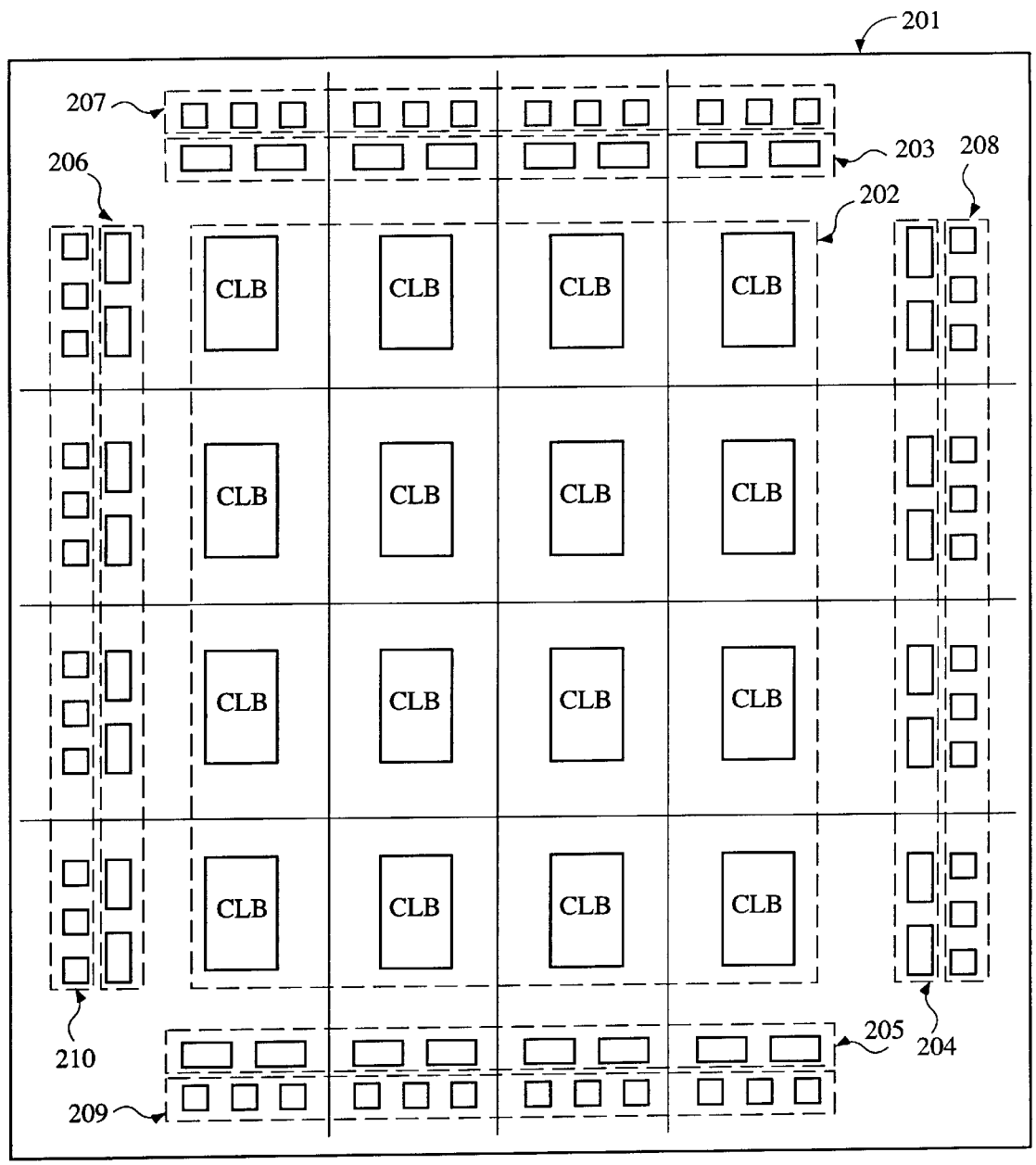
FIG. 2 shows a block diagram of an FPGA layout upon which the present invention may be practiced.

The present invention pertains to a testing circuit that is used to dynamically drive test control signals at higher voltages for testing various signal paths and gates of any programmable logic device, including field programmable gate arrays (FPGAs). FIG. 2 shows a block diagram of one FPGA configuration in which the present invention may be practiced. FPGA 201 includes an illustrative configurable logic block (CLB) array 202. A CLB typically includes multiple gates and elements, such as function generators, flip-flops, buffers, drivers, multiplexers, and registers. Surrounding CLB array 202 are IOBs 203–206 and decoders 207–210 which have corresponding gates that may be tested by the present invention. Gates are used to couple single-length lines to other single-length lines, single-length lines to double-length lines, single-length lines to longlines, and double-length lines to longlines. Each of these signal paths and gates can be tested by using the present invention.

Figure 3:
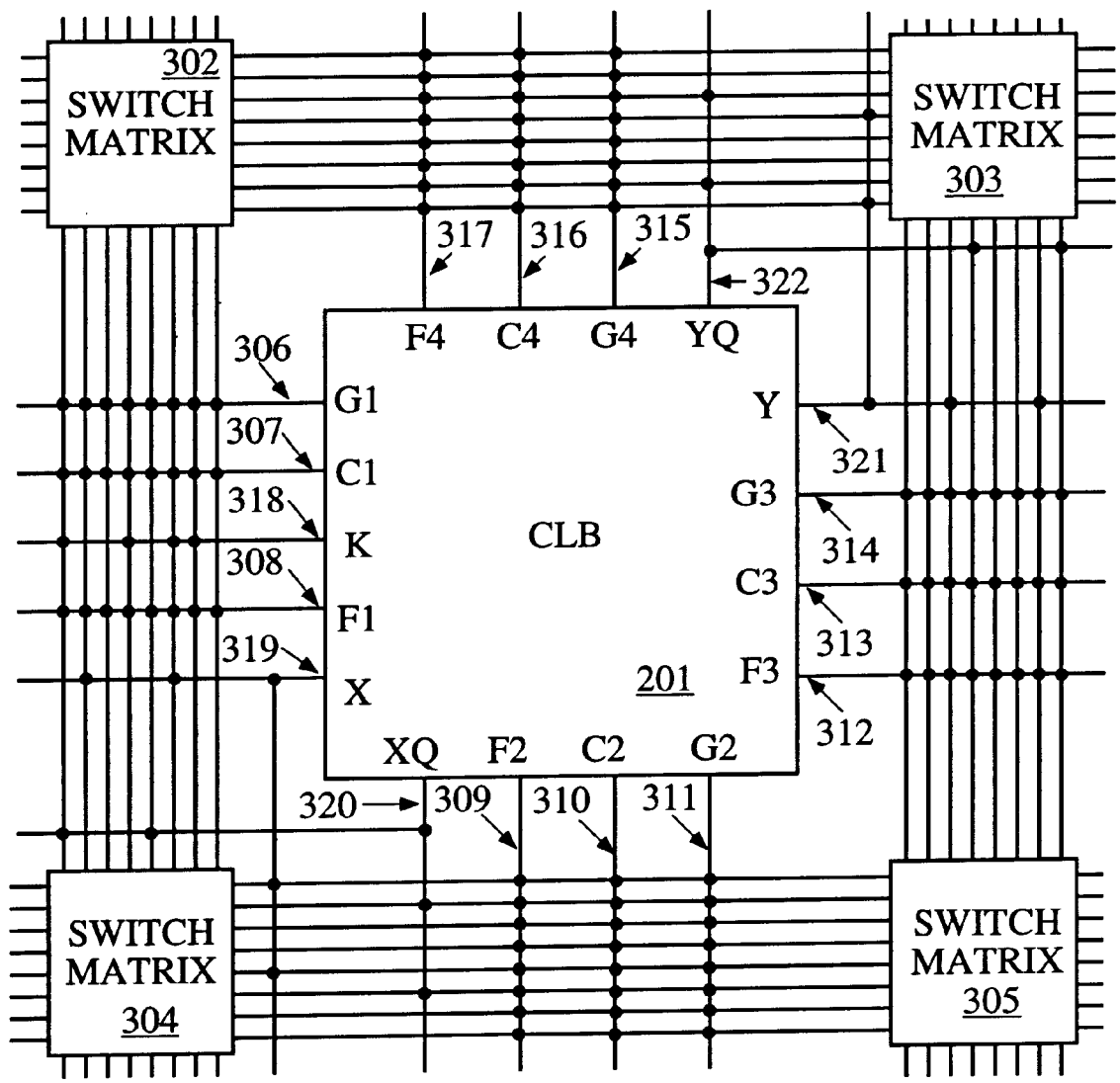
FIG. 3 shows a configurable logic block connected to various switch matrices by using single-length lines.

In one FPGA configuration, a number of pass transistor array switch matrices are used to establish connections between the single-length lines. FIG. 3 shows a circuit diagram showing how a CLB 301 is typically connected to switch matrices 302–305 by using single-length lines. CLB 301 accepts a number of input signals on lines 306–317. The "K" line 318 is used to provide a clocking signal to CLB 301. CLB 301 outputs its signals onto output lines 319–322. Programmable interconnect points (PIPs), shown as black dots, are placed at strategic intersections between vertical and horizontal single-length lines. These PIPs can be programmed to transfer signals between CLB 301 and any of the switch matrices 302–305. Switch matrices 302–305 are used to route signals between CLB 301 and other CLBs or IOBs. The testing circuit of the present invention can be used to test the gates and signal paths associated with the PIPs as well as the switch matrices. A more detailed description of CLBs is found in "The Programmable Logic Date Book", pages 2–9 to 2–16, (1994) published by Xilinx, Inc., having a place of business at 2100 Logic Drive, San Jose, Calif. 95124.

Figure 4:
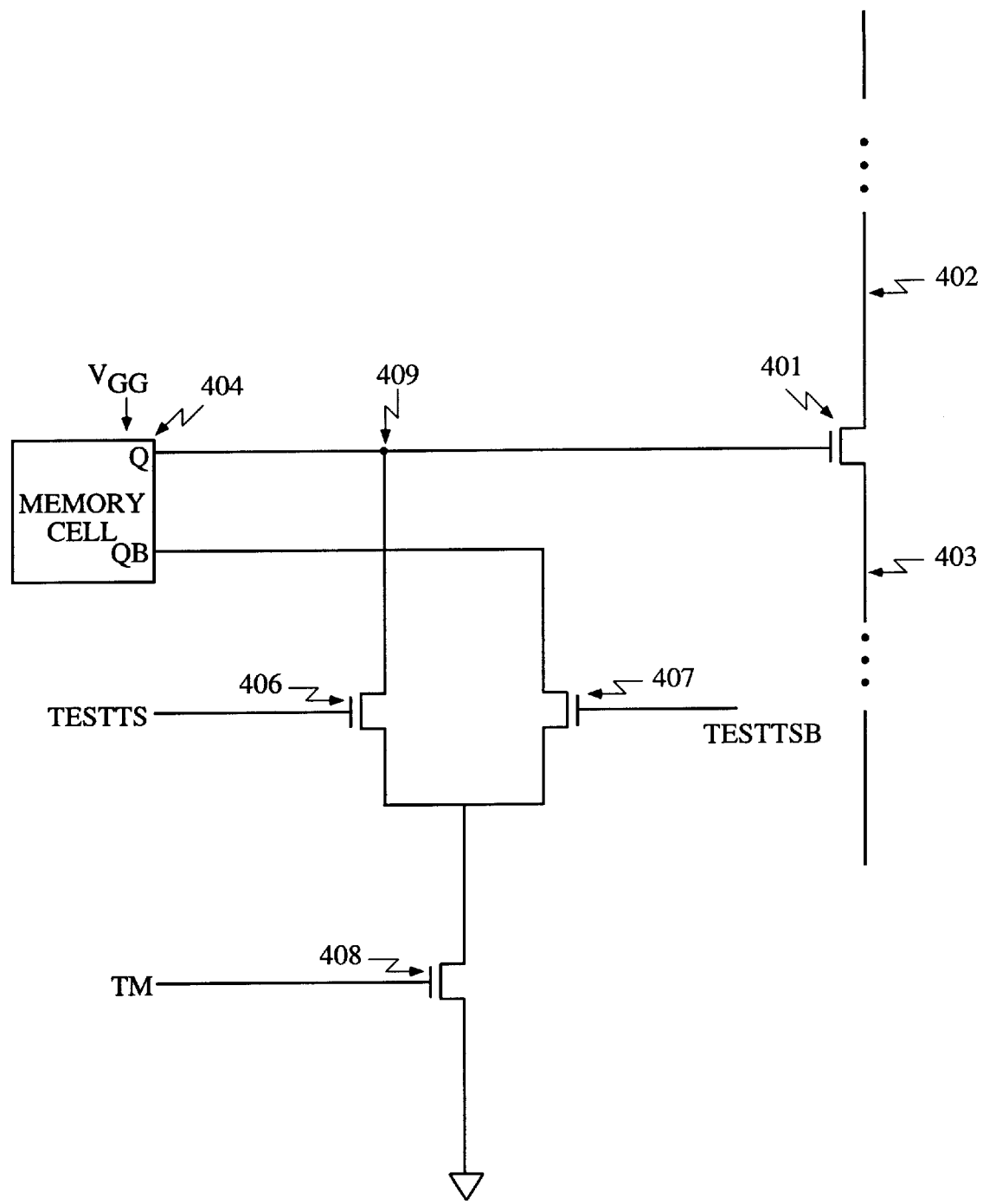
FIG. 4 shows one embodiment of the testing circuit of the present invention.

FIG. 4 shows one embodiment of the testing circuit of the present invention in which an n-channel transistor 401 controls whether an electrical signal on line 402 is conducted onto line 403 (hereinafter, the term "electrical signal" refers to a signal being propagated through the lines and gates, wherein the term "test signal" refers to a signal used to control the switching of a gate for testing purposes). The n-channel transistor 401 is commonly referred to as a "pass" gate. Line 402 can be a local interconnect line, single-length line, double-length line, or a longline. Similarly, line 403 can be a local interconnect line, single-length line, double-length line, or a longline. The operation of pass gate 401 is controlled by a storage/memory element 404. Memory 404 is programmed by the user to store a bit of information according to a configuration that is desired by the user. When memory 404 is programmed to output a high signal, the electrical signal on line 402 is conducted onto line 403. Conversely, a low-level Q output from memory cell 404 causes the pass gate 401 to isolate the electrical signal on line 402 from line 403. In one embodiment, a voltage $V_{GG}$ is supplied to memory 404, wherein $V_{GG} \geq V_{DD}$ (a supply voltage)+$V_{TN}$ (the threshold voltage of pass gate 401). In other words, voltage $V_{GG}$ is at a threshold greater than the supply voltage. In one circuit, $V_{GG} \approx 5.0 + (1.0$ to $1.4) = 6.2$ to 6.4 volts. Voltage $V_{GG}$ can be generated many different ways (e.g., from a power supply, voltage regulator, or pump). Hence, in accordance with the present invention, the Q output terminal of memory cell 404 provides either voltage $V_{GG}$ or a 0 volt signal to respectively turn on or turn off transistor 401. Voltage $V_{GG}$, instead of a conventional supply voltage $V_{DD}$ (+5 volt), is applied to the gate of transistor 401 to compensate for the body effects voltage drop associated with transistor 401.

In the currently preferred embodiment, three n-channel transistors 406–408 and three test signals, Test Tri-State (TESTTS), Test Tri-State Bar (TESTTSB), and Test Mode (TM), are used to selectively turn on and turn off pass gate 401 to test the signal path from line 402, through pass gate 401, and onto line 403. Specifically, if test signal TM is low (e.g., 0 volts), transistor 408 is turned off. In this manner, the gate of transistor 401 is isolated from ground, irrespective of the states of transistors 406 and 407 and test signals TESTTS and TESTTSB. Consequently, whenever test signal TM is low, the Q output signal from memory cell 404 is applied to the gate of transistor 401. Thus, if memory cell 404 has been programmed to output voltage $V_{GG}$ on the Q output terminal, then transistor 401 is turned on. Otherwise, if memory cell 404 is programmed to output a 0 volt signal on the Q output terminal, then transistor 401 is turned off.

However, if test signal TM is high (e.g., +5 or +7 volts), then transistor 408 is conducting. As a result, the voltage on the gate of transistor 401 can be either at voltage $V_{GG}$ or be pulled down to ground (i.e., 0 volts), depending on the state of the TESTTS signal. A high TESTTS signal (e.g., +5 or +7 volts) and a high TM signal cause transistors 406 and 408 to be ON, thus pulling the Q output signal to ground and in turn the QB output signal to voltage $V_{GG}$. Consequently, transistor 401 is non-conducting. On the other hand, a low TESTTS signal and a high TM signal cause transistor 407 and 408 to be ON, thus pulling the QB output signal to ground and in turn the Q output signal to voltage $V_{GG}$. Consequently, transistor 401 is conducting. Table 1 below describes the relationships between the test signals and their effect on transistor 401.

TABLE 1

Test Signals and Their Effects on Pass Gate 401

| TM | TESTTS | Pass Gate |
|---|---|---|
| 0 | 0 | Q |
| 0 | 1 | Q |
| 1 | 0 | ON |
| 1 | 1 | OFF |

Figure 5:
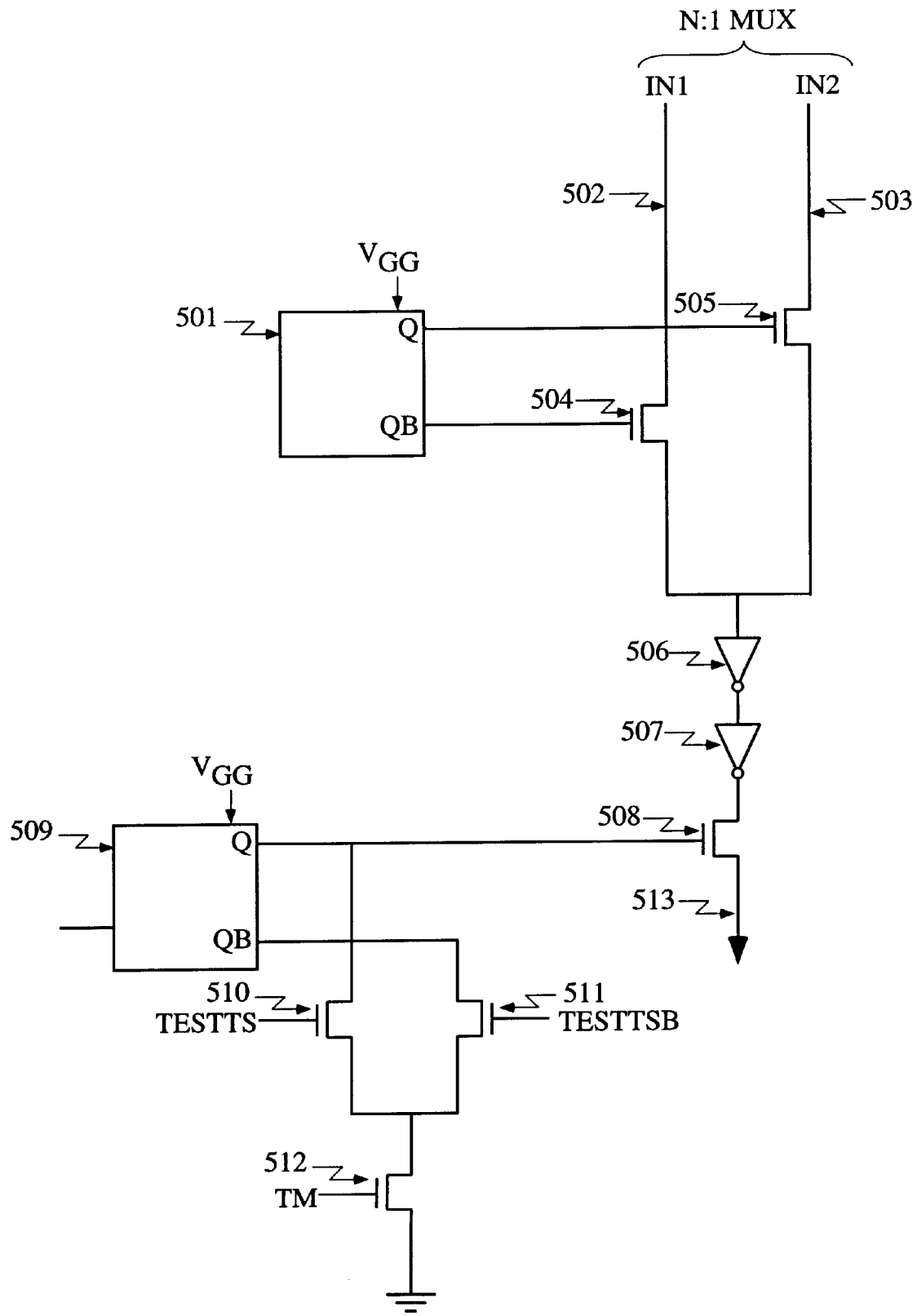
FIG. 5 shows one embodiment of the present invention for testing the signal path from either of two local lines through a pass gate onto another line.

FIG. 5 shows one embodiment of the present invention for testing the signal path from either of the two lines 502 and 503, through inverters 506 and 507, and through pass gate 508, onto line 513. A memory cell 501 is programmed to control transistors 504 and 505 so that either the electrical signal on local line 502 or local line 503 is provided to inverter 506. Inverters 506 and 507 perform the function of a buffer. In the normal mode of operation, memory cell 509 is programmed by the user to control pass gate 508 so that the electrical signal driven by inverter 507 is either conducted onto or isolated from line 513. Transistors 510–512 and test signals TESTTS, TESTTSB, and TM are used to selectively control pass gate 508 for testing purposes. A test signal is placed onto either of the lines 502 or 503; the test circuitry is used to control pass gate 508; and the output signal is monitored on line 513 to determine whether a correct signal was detected. It should be noted that the testing process described above can be implemented for any gate residing within any programmable logic device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention only be defined by the Claims appended hereto and their equivalents.

What is claimed is:

1. A method of testing a signal path from a first line, through a pass gate, and onto a second line, wherein the method comprises the steps of:

programming a memory to control the pass gate;

providing a test signal to a first transistor operatively coupled to the pass gate and a first output terminal of the memory;

inverting the test signal and providing the inverted test signal to a second transistor operatively coupled to a second output terminal of the memory, wherein if a test mode signal is active, then the first and second transistors determine whether a high voltage or a low voltage is applied to control the pass gate;

conducting an electrical signal through the first line, the pass gate, and the second line;

controlling the operation of the pass gate according to the test signal and the inverted test signal; and monitoring the electrical signal to determine whether there is an error in the signal path.

2. The method of claim 1, wherein a memory output signal is at a threshold voltage greater than an electrical signal voltage.

3. The method of claim 1 further comprising the step of buffering the electrical signal with two inverters wherein the two inverters are coupled in-between the first line and the first transistor.

4. The method of claim 1, further comprising the step of buffering the electrical signal with two inverters, wherein the two inverters are coupled in-between the first line and the second line.

5. The method of claim 1 further comprising the steps of:

storing a configuration bit in a second memory;

multiplexing the electrical signal between at least two lines coupled to the pass gate according to the configuration bit stored in the second memory cell.

6. A test circuit for testing a signal path including a first line, a pass gate, and a second line, the test circuit comprising:

a storage means coupled to the pass gate for storing a configuration bit;

a first transistor operatively coupled to the pass gate and the storage means, the first transistor controlled by a test signal;

a second transistor operatively coupled to the storage means, the second transistor controlled by an inverted test signal; and a third transistor operatively coupled to the first and second transistors and to ground, wherein the third transistor is controlled by a test mode signal, wherein if the test mode signal is active, then the pass gate is placed in either a conducting or non-conducting state according to the test signal.

7. The test circuit of claim 6 further comprising a buffer that is coupled between the first line and the first transistor for driving an electrical signal on the signal path.

8. The test circuit of claim 6 further comprising a buffer that is coupled between the first transistor and the second line.

9. The test circuit of claim 6 further comprising a second storage means for storing a second configuration bit that is used to multiplex an electrical signal between a plurality of lines coupled to the pass gate.

* * * * *